United States Patent
Watts et al.

(10) Patent No.: US 7,046,080 B2
(45) Date of Patent: May 16, 2006

(54) SIGNAL PROCESSING CIRCUIT

(76) Inventors: Robert David Watts, 2 Brooklea, Caerleon Newport NP18 3PR (GB); John Alexander Westlake, 66 Rue Pierre Demours, Paris 75017 (FR)

( * ) Notice: Subject to any disclaimer, the term of this patent is extended or adjusted under 35 U.S.C. 154(b) by 12 days.

(21) Appl. No.: 10/476,200

(22) PCT Filed: Apr. 22, 2002

(86) PCT No.: PCT/GB02/01815

§ 371 (c)(1),
(2), (4) Date: Oct. 22, 2004

(87) PCT Pub. No.: WO02/089321

PCT Pub. Date: Nov. 7, 2002

(65) Prior Publication Data

US 2005/0054307 A1   Mar. 10, 2005

(30) Foreign Application Priority Data

Apr. 27, 2001 (GB) ................................. 0110340.7

(51) Int. Cl.
*H03F 3/38* (2006.01)
(52) U.S. Cl. ........................ 330/10; 330/110; 330/109; 330/207 A
(58) Field of Classification Search ................. 330/10, 330/207 A, 251, 109, 110
See application file for complete search history.

(56) References Cited

U.S. PATENT DOCUMENTS

| 4,458,208 A | 7/1984 | Abe |
| 4,843,339 A | 6/1989 | Burt et al. |

(Continued)

FOREIGN PATENT DOCUMENTS

DE  196 19 208 A1   11/1997

(Continued)

OTHER PUBLICATIONS

AES Preprint—New Concepts in Pulse-Width Modulation—(J. Vanderkooy) Presented Nov. 10-13, 1994, San Francisco—pp. 1-33 including drawings.

*Primary Examiner*—Patricia Nguyen
(74) *Attorney, Agent, or Firm*—Foley & Lardner LLP

(57) ABSTRACT

A signal processing circuit comprises a difference stage for receiving an input signal to be processed and a feedback signal taken from an output signal of the circuit. The difference stage generates a difference signal corresponding to the difference between the input and feedback signal. An integrator stage is coupled to the difference stage to receive the difference signal and output an integrated signal. A time continuous pulse width modulating stage is coupled to the integrator stage to receive the integrated signal and to modulate the signal with reference to a continuously varying carrier signal. A continuous time feedback path is coupled to the output of the modulating stage and an input or the difference stage. The integrator stage comprises at least two integrators to provide second or higher order integration.

20 Claims, 3 Drawing Sheets

U.S. PATENT DOCUMENTS

| | | |
|---|---|---|
| 4,952,884 A | 8/1990 | Tokumo et al. |
| 5,218,315 A | 6/1993 | Turner |
| 5,352,986 A | 10/1994 | Modgil et al. |
| 5,777,512 A | 7/1998 | Tripathi et al. |
| 5,805,020 A * | 9/1998 | Danz et al. ............... 330/10 |
| 6,064,259 A * | 5/2000 | Takita ...................... 330/10 |
| 6,297,692 B1 * | 10/2001 | Nielsen .................... 330/10 |
| 6,346,852 B1 * | 2/2002 | Masini et al. ............ 330/10 |
| 2004/0189377 A1 * | 9/2004 | Lee ........................... 330/10 |

FOREIGN PATENT DOCUMENTS

| | | |
|---|---|---|
| EP | 0616422 B1 | 9/1994 |
| JP | 63-69465 | 3/1988 |
| WO | WO94/17588 | 8/1994 |
| WO | WO97/49175 | 12/1997 |
| WO | WO99/38255 | 7/1999 |

* cited by examiner

SIGNAL PROCESSING CIRCUIT

The present invention relates to a signal processing circuit. Particularly, but not exclusively, the invention relates to an amplifier circuit such as an audio power amplifier.

Audio power amplifier systems have traditionally used linear (class A or class AB) amplifiers. Linear amplifiers are, however, inherently inefficient. Heat dissipation and power supply requirements of linear amplifiers can be particularly problematical in modern electronic consumer products such as personal computers and multi-media systems. This has lead to the development of various alternative approaches to audio amplification.

One such approach is the "switching", or Class-D, amplifier. Essentially, Class-D amplifiers work by varying the duty cycle of a pulse width modulated (PWM) signal. A Class-D amplifier essentially comprises a continuous time pulse width modulator coupled between audio input and power output stages. The pulse width modulator comprises a comparator which receives the input audio signal and a reference carrier signal which continuously varies at the desired switching frequency (typically ten times the highest frequency of the desired audio output).

The reference signal can be any periodic signal but is usually a continuous triangular wave (typically plus or minus 5 volts). The output of the modulator is a rapidly switching square wave which is fed to the output stage. The output stage transistors (typically power mosfets in a H-bridge configuration) therefore operate the majority of the time either fully on or fully off (ideally never operating in mid-conduction) which reduces power dissipation and increases efficiency. The resulting output signal is a rapidly switching square wave with a duty cycle proportional to the amplitude of the input audio signal. This may then be supplied to a speaker, via an output filter circuit if appropriate.

Conventional class D amplifiers have very high efficiency but relatively poor distortion and noise performance and thus relatively poor sound quality.

An alternative type of amplifier with improved performance is the delta-sigma amplifier. A delta-sigma amplifier may have an output stage identical to that of a conventional Class-D amplifier but differs in that delta-sigma modulation is used rather than time continuous pulse width modulation. In particular, a feedback structure, conventional in delta-sigma modulators, is used to improve performance. Thus, a typical delta-sigma amplifier comprises a time quantised comparator with a feedback path from the comparator output to a subtractor at which the output is compared to the audio input. The output of the subtractor is supplied to an integrator stage the output of which is input into the comparator. The integrator integrates the error voltage so that the system constantly minimises the error by adjusting the output data stream.

A simple first order delta-sigma modulator comprises a single integrator. It is however loom to improve the performance of a delta-sigma modulator by using more than one integrator but such higher order modulators can become difficult to stabilise. In particular, the tap coefficients needed to stabilise an nth order delta-sigma modulator reduce the effectiveness of the feedback so that little benefit is gained by employing great 4th order.

Although improving on the performance of conventional Class-D amplifiers, delta-sigma amplifiers nevertheless suffer from significant distortion and noise, principally due to the time sampling of the quantiser.

A Class-D amplifier with a feedback loop similar to that of a delta-sigma amplifier has been proposed. Essentially this employs a first order integration stage which outputs to a time continuous pulse width modulator.

It is an object of the present invention to provide a power amplifier circuit with reduced distortion and noise compared with conventional amplifier circuits. The invention is not, however, limited to power amplifier circuits. It is thus a more general object of the present invention to provide a signal processing circuit with improved noise and distortion performance. According to the present invention there is provided a signal processing circuit comprising:

a difference stage for receiving an input signal to be processed and a feedback signal taken from an output signal of the circuit the difference stage generating a difference signal corresponding to the difference between the input and feedback signal;

an integrator stage coupled to said difference stage to receive said difference signal and outputting an integrated signal;

a time continuous pulse width modulating stage coupled to the the integrator stage to receive the integrated signal and to modulate said signal with reference to a continuously varying career signal; and a continuous time feedback path coupled to the output of the modulating stage and an input of the difference stage;

wherein the integrator stage comprises at least two integrator to provide second or higher order integration.

The provision of second or higher order feedback significantly improves performance by reducing noise and distortion to negligible levels as is discussed further below.

Preferred embodiments of the invention take advantage of the high feedback levels by utilising a spread spectrum carrier signal to reduce the effect of electromagnetic emissions.

This aspect of the invention combines the inherent linearity of a continuous time PWM modulator, and the very high level of corrective feedback offered by the integrator stage, to correct for any system errors including, but not limited to,—power supply unit noise and modulation, carrier distortions including spread-spectrum randomisation, output stage errors, dead time errors & comparator propagation delay dispersion errors.

For instance, designers have traditionally been force to shy away from implementing switching amplifiers or switching power supply in consumer electronic devices due to there undesirable side effect of generating RF and electrical noise. Not only does this make trying to incorporate any form of switching unit into a low noise, or RF sensitive design such as RF tuners, very difficult; products incorporating "switching based techniques" have received bad press due to there electrical noise and emissions causing intermodulation by-products within the audio bands resulting in an undesirable "sonic signature".

In consumer electronics the typically RF bands of interest are the "AM" band around 250 KHz to 1500 KHz, and the "FM" band from 88 MHz to about 110 MHz. For the AM band, which is at the lower-end of the RF spectrum, the propagation effect of the conducted emissions (H-Field) is very effective. It is nearly impossible to shield against conducted emissions, i.e. magnetic component field leakage, within the confines of a small-integrated "consumer" priced product. The only real practical conventional solution for the AM band reception is to use a switching frequency above the highest required reception frequency. However the modulation bandwidth of the modulator (say 200 KHz), will be centered +/_ around the carrier frequency. Thus for AM reception up to 1600 KHz, this dictates a switching frequency above 1.8 MHz. For optimal efficiency the switching frequency should however be no more the required.

Although switching above 1.8 MHz results in satisfactory AM performance, the same cannot be said for the FM band since switching units operate with "squared waves", which in theory can contain an infinite spectrum of "HF" components. Due to the higher frequency of these components, the propagation of "E-field component" is very effective. Although screening and high order filtering techniques can go a long way to reducing "E-field" emission problems, they can never be 100% effective. These measures also add too product cost aid complexity.

As RF emissions are harmonically spaced, they introduce discrete carriers within the "FM band". This causes a severe problem with modern day "Auto Seek" receivers, which scan the "FM" band for carriers of significant signal strength. Using switching units within such receivers results in the "Auto Seek" level detectors stopping at every RF harmonic of the switching unit's carrier, making them practically useless.

The solution to this problem provided by the present invention is to use a spread-spectrum carrier. As the carrier is not correlated to the input signal, there will be no discrete harmonics of the carrier at higher frequencies, just a lower level noise. This background noise will reduce the signal/noise ratio of the receiver, but will enable the tuning circuits to function correctly in the presence of the switching carrier.

Traditionally spread spectrum techniques have not been possible for high performance low distortion and noise switching applications. In a switching based power supply unit for instance, a spread spectrum carrier results in LF noise on the output rails, due to the normally low levels of feedback available. Satisfactory filtering of this LF noise requires large value de-coupling capacitors and magnetics, both of which are detrimental to the size and cost of the end product. Likewise in a switching amplifier, modulation of the carrier results in poor distortion and noise performance. These problems are overcome by the present invention.

Another benefit of using a spread spectrum carrier is the randomisation of any aliasing distortion products demodulated within the audio band. 100% HF/RF filtering of the input is not practical both in sonic and cost terms. Aliasing distortion artefacts are becoming increasing problematic with the increasing use off "RF noisy" digital based audio input sources such as CD and DVD players. By randomising the carrier, the resultant aliasing intermodulation products no longer cause discrete tones on the noise floor, but are effectively randomised, gently increasing the noise floor—a much preferable situation from a sonic point of view.

A specific embodiment of the present invention will now be described, by way of example only, with reference to the accompanying drawings, in which.

Figure 1:
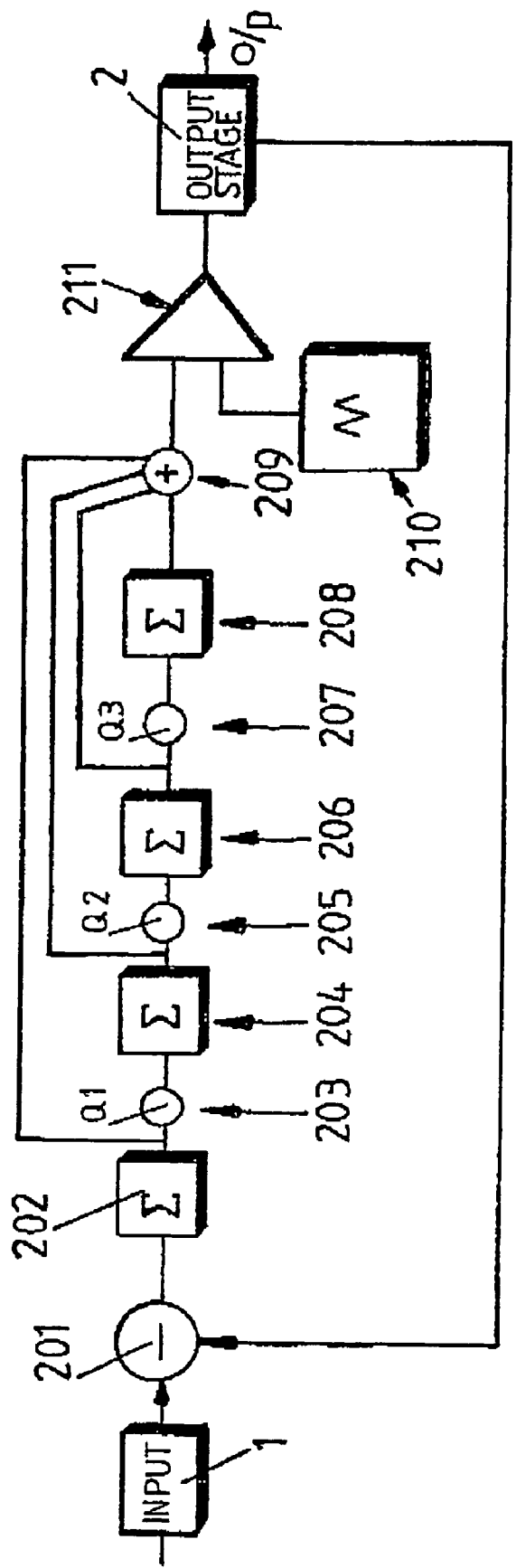
FIG. 1 is a simplified block diagram of a modulator circuit embodying the present invention.

Referring to FIG. 1, the illustrated circuit is a simple single ended modulator which essentially consists of a difference stage comprising a subtractor 201; a fourth order integrator stage comprising four cascaded integrators 202, 204, 206, 208 and an adder 209; and a continuous time pulse with modulating stage comprising a comparator 211 and reference carrier signal generator 210. The modulator circuit receives an input analogue signal from an input stage 1 and delivers a pulse with modulated output signal to an output stage 2. A feedback path is provided between the output stage 2 and the subtractor 201.

In operation, the output signal is subtracted from the input signal at the subtractor 201 and the resultant error signal is fed to the first integrator 202 of the integrator stage. The four integrators 202, 204, 206 and 208 are cascaded and coupled together via tap coefficients 203, 205 and 207 which are attenuators with values set appropriately to ensure stability. The outputs of the four integrators are summed at adder 209 and the summed signal is fed to one input of the comparator 211. The second input of the comparator 211 receives a continuously varying reference carrier signal from the signal generator 210. The comparator quantifies the input signal with respect to amplitude and outputs a pulse width modulated square wave of infinite resolution with a duty cycle which varies in proportion to the varying amplitude of the original input signal.

The input and output stages may be entirely conventions and designed to suite the particular application to which the invention is put. For instance, in an audio power amplifier application the input and output stages may be conventional Class-D stages, the output stage for example comprising a power MOSFET switching stage coupled to an LC output filter. In such an application the feedback signal is taken from the output of the switching transistors. Similarly, the modulator stage may be entirely conventional as is, for instance, found in a typical Class-D amplifier. The carrier signal may be any suitable periodic signal such as a continuous triangular wave as is commonly used as a reference signal in conventional Class amplifiers.

A fundamental difference between the circuit in accordance with the present invention and conventional modulating circuitry as found, for instance, in Class-D amplifiers, is the provision of a greater than first order integrator stage providing high levels of feedback which substantially reduces noise and distortion in the output signal. The noise reduction is significantly greater than at that could be expected from a first order modulator as for instance disclosed in the Motorola application note referred to above. Indeed, with the present invention all in band Class-D distortion is reduced to negligible levels, including distortion in the output stage, the comparator, the power supply and the reference signal.

The invention also improves upon the performance of conventional delta-signal modulators by eliminating the distortion and noise associated with the inherently limited resolution of the discrete time quanitiser of a delta-sigma modulator. With the present invention the input signal is quantised with respect to amplitude only so that the output has infinite time resolution.

Although, as mentioned above, the modulator stage, and in particular the carrier signal generator, may be entirely conventional, preferred embodiments of the present invention employ spread spectrum techniques to reduce radiated electromagnetic interference which manifests as noise in the RF spectrum. Essentially the high levels of global feedback provided by the integrator stage enables the application of conventional spread spectrum techniques to the carrier signal generator to vary (either randomly or periodically) the frequency of the carrier to spread the energy of the signal and reduce correlated RF noise. Such techniques are well known in communications systems but have not previously been applied in continuous pulse width modulator cats. For instance in conventional Class-D amplifier circuits a spread spectrum carrier signal would not be contemplated since it would simply introduce unacceptable noise into the audio output signal. With the present invention however that noise is eliminated by the feedback.

A variety of different techniques may be envisaged to spread the spectrum of the carrier signal. The particular circuit implementation is not important provided the resulting carrier signal has a spread spectrum which is not correlated to the input signal (whether for instance a truly random or "weighted" noise source).

Figure 2:
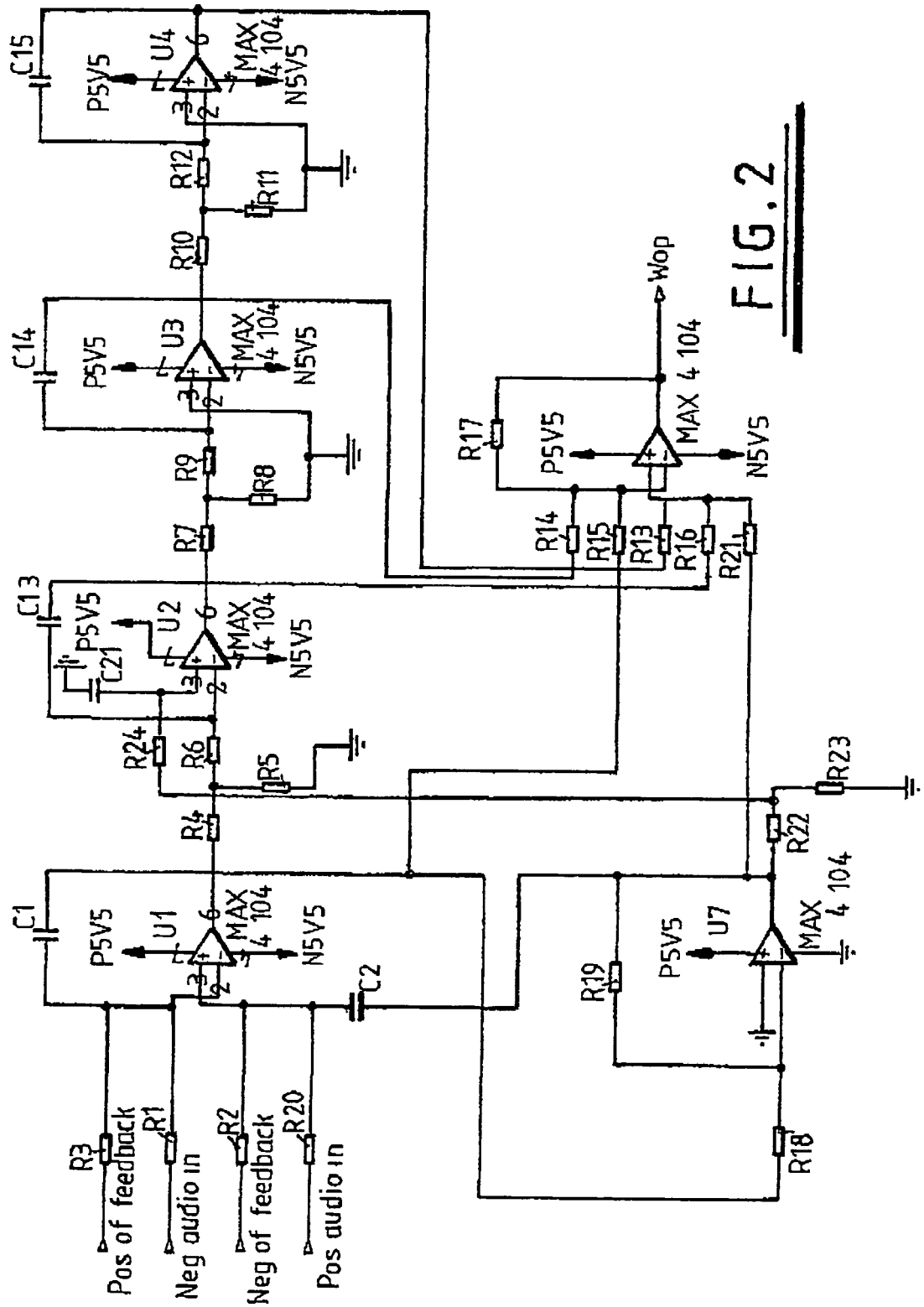
FIG. 2 is a schematic circuit diagram of one preferred embodiment of the integrator stage of the circuit of FIG. 1.
Figure 3:
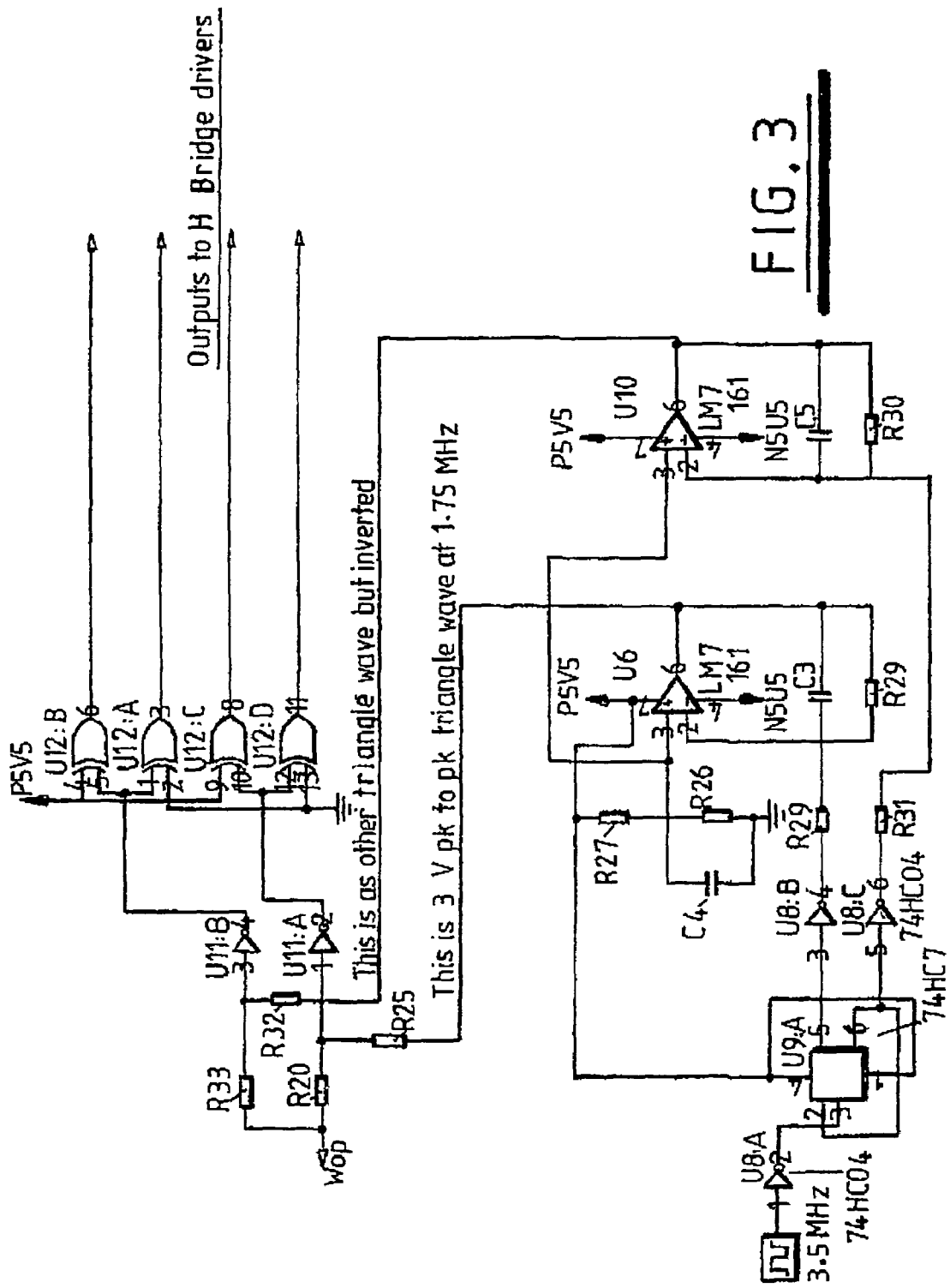
FIG. 3 is a schematic circuit diagram of one preferred embodiment of a modulator stage of the circuit of FIG. 1.

Specific circuit implementations of the present invention are illustrated in FIGS. 2 and 3 which exemplify the application of the invention, including a non-signal correlated carrier, in an audio power amplifier circuit.

FIG. 2 shows a schematic of the integrator stage which is in differential format for use with conventional Class-D H Bridge output stages. Resistors R1, R2, R3 and R20 comprise the feedback resistors for the amplifier and determine the gain. U1 is a combined subtractor and integrator. U7 provides an inverted output in order to maintain improved common mode performance of the input section R4, R5 and R22, R23 are the first tap coefficients. U2 is the second order integrator set up as a differential to single ended converting integrator. R7 and R8 provide the second tap coefficient, U3 the third integrator, R10 and R11 the third tap coefficient with the final integrator provided by U4. The outputs of each integrator are summed by U5 with the final analogue output voltage WOP. All the integrators are continuous time; thus the output is completely covered by the continuous feedback.

FIG. 3 shows the schematic of the pulse width modulator. This takes the output from the integrator stage and generates two out of phase pulse width modulated signals for each side of the H Bridge output. The output from the integrator stage WOP is fed to two comparators U11a and U11b via resistors r33 and r20. The threshold voltage is effectively modulated by mid a triangular waveforms of opposite phase via resistors R32 R25. This comparator is low cost, but gives excellent performance, with low propagation delay error. The digital outputs are generated by U12, for feeding to the H Bridge outputs.

The two 180 deg. out of phase triangular waves are generated from a 3.5 MHz clock input from the Spread-Spectrum VCO. This is divided by two, by flip-flop U9 generating 1.75 MHz. This has complementary square wave outputs, which are fed to u6 and u10. These convert the square wave into a triangular wave In the above embodiment of the invention the carrier spectrum is spread by modulating the clock. One possible alternative would be to introduce noise into the audio path by, for instance, adding a shaped noise source to the output of the modulator.

It will be appreciated by the that many modifications ban be made to the detailed circuitry described above. Appropriate circuit designs to implement the present invention in a wide variety of applications will be apparent to the skilled person. In particular it will be understood that the invention is not limited to audio amplifier systems but can be used in any application requiring switched signal modulation such as, for instance, in a switched power supply nut. Many other possible applications of the invention will be readily apparent to the appropriately skilled person.

The invention claimed is:

1. A signal processing circuit comprising:
a difference stage for receiving an input signal to be processed and a feedback signal taken from an output signal of the circuit, the difference stage generating a difference signal corresponding to the difference between the input and feedback signal;
an integrator stage coupled to said difference stage to receive said difference signal and outputting an integrated signal;
a time continuous pulse width modulating stage coupled to the integrator stage to receive the integrated signal and to modulate said signal with reference to a continuously varying spread spectrum carrier signal non-correlated to the input signal; and
a continuous time feedback path coupled to the output of the modulating stage and an input of the difference stage;
wherein the integrator stage comprises at least two integrators to provide second or higher order integration.

2. A signal processing circuit according to claim 1, wherein the modulating stage comprises a comparator which receives said integrated and reference carrier signals, and a reference signal generator which supplies a non-signal correlated spread spectrum carrier signal to said comparator.

3. A signal processing circuit according to claim 2, wherein said reference signal generator comprises a clock which is modulated to spread the spectrum of the signal.

4. A signal processing circuit according to claim 1, wherein the spectrum of the carrier signal is spread by introducing noise into the signal path before feedback to the difference stage.

5. A signal processing circuit according to claim 1, further comprising a power switching stage having an input and an output, the input being coupled to the output of the modulator stage and the feedback path being couple to the output of the switching stage.

6. A signal processing circuit according to claim 1, wherein the integrator stage comprises two or more cascaded integrators and an adder which sums the outputs of the integrators.

7. A signal processing circuit according to claim 6, wherein said integrators are coupled together via tap coefficients which stabilize the integrator stage.

8. A signal processing circuit according to claim 1, wherein the difference stage and integrating stage are combined by provision of a combined subtractor/integrator.

9. A signal processing circuit according to claim 2, further comprising a power switching stage having an input and an output, the input being coupled to the output of the modulator stage and the feedback path being couple to the output of the switching stage.

10. A signal processing circuit according to claim 3, further comprising a power switching stage having an input and an output, the input being coupled to the output of the modulator stage and the feedback path being couple to the output of the switching stage.

11. A signal processing circuit according to claim 4, further comprising a power switching stage having an input and an output, the input being coupled to the output of the modulator stage and the feedback path being couple to the output of the switching stage.

12. A signal processing circuit according to claim 2, wherein the integrator stage comprises two or more cascaded integrators and an adder which sums the outputs of the integrators.

13. A signal processing circuit according to claim 3, wherein the integrator stage comprises two or more cascaded integrators and an adder which sums the outputs of the integrators.

14. A signal processing circuit according to claim 4, wherein the integrator stage comprises two or more cascaded integrators and an adder which sums the outputs of the integrators.

15. A signal processing circuit according to claim 5, wherein the integrator stage comprises two or more cascaded integrators and an adder which sums the outputs of the integrators.

16. A signal processing circuit according to claim 2, wherein the difference stage and integrating stage are combined by provision of a combined subtractor/integrator.

17. A signal processing circuit according to claim 3, wherein the difference stage and integrating stage are combined by provision of a combined subtractor/integrator.

18. A signal processing circuit according to claim 4, wherein the difference stage and integrating stage are combined by provision of a combined subtractor/integrator.

19. A signal processing circuit according to claim 5, wherein the difference stage and integrating stage are combined by provision of a combined subtractor/integrator.

20. A signal processing circuit according to claim 6, wherein the difference stage and integrating stage are combined by provision of a combined subtractor/integrator.

* * * * *